United States Patent [19]

Valentine, Jr. et al.

[11] Patent Number: 4,920,068
[45] Date of Patent: Apr. 24, 1990

[54] METALORGANIC VAPOR PHASE EPITAXIAL GROWTH OF GROUP II-VI SEMICONDUCTOR MATERIALS

[75] Inventors: Donald Valentine, Jr., Ridgefield; Duncan W. Brown, Wilton, both of Conn.

[73] Assignee: American Cyanamid Company, Stamford, Conn.

[21] Appl. No.: 847,370

[22] Filed: Apr. 2, 1986

[51] Int. Cl.⁵ .............................................. H01L 21/20
[52] U.S. Cl. .............................. 437/81; 148/DIG. 64; 148/DIG. 110; 156/613; 437/88
[58] Field of Search ................ 148/175, 174, DIG. 16, 148/64, 57, 110; 29/576 E; 156/612-614, 610; 427/87, 248.1, 252, 252.2; 437/88, 81

[56] References Cited

U.S. PATENT DOCUMENTS

| | | | |
|---|---|---|---|
| 3,218,203 | 11/1965 | Ruehrwein | 148/175 |
| 3,224,912 | 12/1965 | Ruehrwein | 148/175 |
| 3,312,570 | 4/1967 | Ruehrwein | 148/175 |
| 3,462,323 | 8/1969 | Groves | 148/175 |
| 4,439,267 | 3/1984 | Jackson, Jr. | 156/614 |
| 4,509,997 | 4/1985 | Cockayne et al. | 148/175 |
| 4,568,397 | 2/1986 | Hoke et al. | 148/175 |

FOREIGN PATENT DOCUMENTS 2078695  1/1982 United Kingdom ................ 148/175

OTHER PUBLICATIONS

F. Fringuelli et al., "Tellurophene and Related Compounds", Adv. in Heterocyclic Chem., vol. 21, 1977, pp. 119-121.

W. E. Hoke and P. J. Lemonias, "Metalorganic Growth of CdTe and HgCdTe Epitaxial Films at a Reduced Substrate Temperature Using Diisapropyltelluride", Appl. Phys. Lett., 46(4), 15, Feb. 1985.

Morrison and Boyd, "Organic Chemistry", Allyn and Bacon, Boston, Ma. (Jun. 1980), pp. 102-103, 213-214.

Primary Examiner—Brian E. Hearn
Assistant Examiner—William Bunch
Attorney, Agent, or Firm—Gordon L. Hart; William H. Calnan

[57] ABSTRACT

A process to produce one or more Group II-VI epitazial layers over a crystalline substrate by directing flows of one or more Group II components and a Group VI metalorganic vapor to a heated substrate whereby the vapors thereby react to form the epitaxial layer(s), is improved in terms of lower reaction temperatures and higher product quality if, as the Group VI metalorganic vapor source, there is used a tellurium compound of the formula:

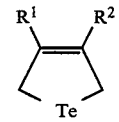

wherein $R^1$ and $R^2$ are, independently, hydrogen or $C_1$-$C_4$ alkyl, preferably, hydrogen.

2 Claims, No Drawings

METALORGANIC VAPOR PHASE EPITAXIAL GROWTH OF GROUP II-VI SEMICONDUCTOR MATERIALS

This invention relates to epitaxial growth techniques, and more particularly, to epitaxial growth of Group II-VI semiconductor materials.

BACKGROUND OF THE INVENTION

Semiconductor materials of Group II-VI elements and especially those containing mercury, cadmium and tellurium are particularly useful as photodetectors for infrared applications. A variety of methods are known for the deposit of crystals of the above elements on substrates and these include: liquid phase epitaxy, elemental vapor phase transport, encapsulated closed-space diffusion, molecular beam epitaxy, and metalorganic chemical vapor deposition (MOCVD), also known as organo-metallic vapor phase epitaxy (OMVPE). The latter method is a most convenient and practical method for producing high quality epitaxial films. However, it has not been very successful in the case of mercury, cadmium, tellurium compounds due to the high temperature required for the decomposition of dialkyltellurium compounds. An important detrimental consequence of high temperature growth of epitaxial tellurides, such as for example HgCdTe, is the diffusion of high vapor pressure metals such as mercury and cadmium at crystal interfaces resulting in poor product quality. Additional detrimental effects are increased consumption of high purity mercury and generation of toxic mercury waste. In one attempt to minimize this problem, Jackson, U.S. Pat. No. 4,439,267, directs a mixed stream of diethyltellurium and dimethylcadmium to impinge on a CdTe substrate which is placed on a graphite susceptor which also contains a pool of mercury placed in a specially constructed cavity. The susceptor is heated differentially to allow decomposition of the metal alkyls and vaporization of mercury, respectively, to occur at two different temperatures, such as for example 400° C. and 200° C. This process, however, is quite complex and difficult to control. Another approach is that disclosed by Hoke et al., U.S. Pat. No. 4,568,397, in which the mercury is vaporized in an externally heated warm zone and transported to the substrate in a vaporized state, the apparatus requiring a source of heating, e.g., a battery of infrared lamps to maintain the mercury vapor at a temperature above 240° C. to prevent condensation prior to reaching the substrate, the reaction ultimately being carried out at about 400° C., a temperature which is required by the difficulty of decomposing the Group VI metalorganic employed, diethyltellurium. In a recent approach, diisopropyltellurium was used instead of diethyltellurium and epitaxial films of CdTe and HgCdTe were grown at the somewhat lower temperature of 350° C. as described by Hoke et al., Appl. Phys. Lett. 46 (4) 396 (1985). However, even at this temperature cadmium/mercury interdiffusion is still a problem especially in the production of HgTe,CdTe superlattices, which are composed of thin, sub-micron, e.g., 40 to 250 Angstroms, alternating layers of HgTe and CdTe. Superlattices of this type which have semiconductor properties superior to HgCdTe epitaxial films cannot easily be made by vapor phase epitaxy and still lower temperatures are needed to prevent metal interdiffusion between layers. The present invention provides an improved method for the vapor phase epitaxial growth of tellurium-containing films and superlattices in that the temperature of reaction is lowered substantially below the levels previously thought to be operative, e.g., 306°-405° C. for CdTe, as described by Schmidt, J. Vac. Sci. Technol. A 3 (1), Jan./Feb. 1985, while still, at temperatures as low as 250° C., providing high growth rates, e.g., of the order of 5 microns/hr., instead of 0.4 microns/hr.

SUMMARY OF THE INVENTION

In accordance with this invention, high purity metal telluride films can be grown on crystalline substrates through vapor phase epitaxy by use of 2,5-dihydrotellurophene or a derivative thereof or a mixture thereof as the tellurium source. The invention is based on the unexpected finding that by use of the said 2,5-dihydrotellurophenes, a variety of telluride type epitaxial films are produced by organometallic vapor phase epitaxy (OMVPE) at substrate temperatures in the range of from about 220° C. to 500° C., but especially at temperatures below 350° C., and most preferably below 300° C. Telluride films prepared by the method of this invention ar of superior quality and, due to the lower temperature growth conditions possible, they show substantially less interdiffusion of mercury/cadmium. Low temperature growth conditions are particularly important for the preparation of superlattices in which interdiffusion between crystal interfaces is quite critical. Illustrative of the Group II-VI epitaxial films and superlattices that may be produced by this method include, but are not limited to, HgTe, CdTe, ZnTe, HgCdTe, HgMnTe, CdMnTe, CdZnTe, mixtures and combinations of any of the foregoing, and the like.

DETAILED DESCRIPTION OF THE INVENTION

Vapor phase epitaxy is carried out using deposition methods and equipment well known to those skilled in this art. Reference is made to the Handbook on Semi-Conductors edited by T. S. Moss, Volume 3, edited by S. P. Keller, published in 1980 by North-Holland Publishing Company. In Chapter 5, pages 336-355, by H. P. Pogge, is described suitable equipment and typical reactor, substrate and deposition condition influences. The reactors described therein are representative without limitation of reactors can be used to carry out the processes of this invention.

The tellurium compounds useful in this invention include compounds of the formula:

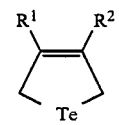

wherein $R^1$ and $R^2$, independently are hydrogen or alkyl of from 1 to about 4 carbon atoms, straight chain or branched, e.g., methyl, ethyl, n-propyl, i-propyl, n-butyl, i-butyl and the like. Specific mention is made of 2,5-dihydrotellurophene, $R^1$, $R^2=H$, 3-methyl-2,5-dihydrotellurophene, $R^1=H$, $R^2=CH_3$, 3,4-dimethyl-2,5-dihydrotellurophene, $R^1$, $R^2=CH_3$, 3-ethyl-2,5-dihydrotellurophene, $R^1=H$, $R^2=CH_2CH_3$, 3,4-diethyl-2,5-dihydrotellurophene, $R^1$, $R^2=CH_2CH_3$, and the like. Preferably, the tellurium compound employed will be 2,5-dihydrotellurophene.

Compounds of the 2,5-dihydrotellurophene type may be generally prepared by the reaction of butadiene or an appropriately-substituted butadiene with tellurium tetrachloride to give the intermediate 2,5-dihydrotellurophene-1,1-dichloride which in turn is reacted with reducing agents, such as for example sodium sulfide to give the corresponding 2,5-dihydrotellurophene or derivative. A more detailed description of their preparation may be found in Bergman et al., J. Am. Chem. Soc. 103 (10) 2715-18 (1981).

A variety of organometallic compounds may be used as sources of other elements required for Group II-VI semiconductor materials. They are normally thermally stable at or about room temperature, e.g., 20°-24° C., and provide sufficient vapor concentration to interact with the foregoing dihydrotellurophenes by vapor phase epitaxy at the surface of the substrate. Illustrative Group II alkyl derivatives include but are not limited to dimethylcadmium, diethylcadmium, dimethylmercury, diethylmercury, mixtures of any of them, and the like, the alkyl group containing, e.g., from about 1 to about 4 carbon atoms. All of these compounds are prepared by well known methods. Alternatively, one or more or all of the Group II components may be supplied in elemental form, e.g., mercury vapor, by diffusion, e.g., from a pool on the susceptor, or by external vaporization followed by transport to the heated substrate in a carrier gas, in accordance with known methods; see the references mentioned above. As used herein and in the claims the term "Group II component(s)" is defined to be the Group II metal providing source(s) whether a Group II element or a Group II metalorganic compound.

The ratio of Group II component(s) to Group VI metalorganic can vary widely, depending, for example, upon the relative vapor pressures of the Group II component(s) and the Group VI metalorganic, the temperature at which the interaction of the Group II component(s) and Group VI metalorganic is occurring, and/or the desired stoichiometry of the deposited layer. Preferably, the mole fraction ratio of the Group VI metalorganic to the Group II component will be from about 0.1 to 1 to about 10 to 1, and, most preferably from about 1 to 1 to about 7 to 1.

In the practice of this invention, vapors of the appropriate Group II component(s), such as dimethylmercury, dimethylcadmium and/or mercury are directed with vapors of 2,5-dihydrotellurophene or a derivative thereof, with or without premixing, at a substrate in a reaction chamber and allowed to impinge on the substrate, e.g., a single crystal of CdTe, InSb, GaAs, InP, sapphire, Si, Ge, zirconia, $BaF_2$, or $CaF_2$. The reactant vapors alone or in a carrier gas introduced to the reactor can be at any conventional temperature, e.g., from 5° C. to 60° C., but 10° C. to 30° C. is preferred, and the introduction of cool vapors, e.g., 10°-20° C. is especially preferred, the temperatures selected being a matter well within the skill of those in this art. In any event, preferably the substrate is in the form of a wafer which rests on a graphite susceptor heated with a radio frequency, r.f., induction heater. A more detailed description of suitable apparati may be found in J. Electrochem. Soc. Solid State Sci. Vol. 116, 1725 (1969), J. Appl. Phys. Vol. 54, 5087 (1983), Applied Phys. Lett. Vol. 46, 398 (1985), the above-mentioned Handbook on Semiconductors, and U.S. Pat. Nos. 4,368,098 and 4,568,397.

Using the method of this invention to be exemplified hereinafter, epitaxial films of CdTe and HgCdTe, respectively, are successfully grown on CdTe and InSb substrates at substrate temperatures of 220°-350° C. At this temperature range and more preferably between 220°-300° C., and most preferably at temperatures between 240° and 300° C., superlattices of HgTe-CdTe are conveniently prepared by the epitaxial growth of alternating thin layers on HgTe and CdTe.

The above epitaxial films and superlattices are superior for infrared detector devices to those prepared by prior art processes not involving 2,5-dihydrotellurophene and/or derivatives thereof as the tellurium source.

DESCRIPTION OF THE PREFERRED EMBODIMENTS

The following Examples illustrate the process and the composites obtained by the practice of this invention. They are not to be construed as limiting the claims in any manner whatsoever.

EXAMPLE 1

Mixed cool vapors of dimethylcadmium and 2,5-dihydrotellurophene are introduced into a water cooled vertical MOCVD reactor using palladiumdiffused hydrogen, both as a diluent and as a carrier gas, typically at a flow rate in the range of 2 to 4 standard liters per minute. A description of the apparatus and equipment that may be used is found in Manasevit, U.S. Pat. No. 4,368,098. The mixture of the above gases (the mole fraction ratio of 2,5-dihydrotellurophene to dimethylcadmium being about 1:1) is allowed to impinge upon a cadmium telluride single crystal substrate placed on a graphite susceptor pedestal. The latter is heated by radio frequency (r.f.) induction. Pyrolytic decomposition of dimethylcadmium and 2,5-dihydrotellurophene and subsequent reaction occurs on the heated surface of the substrate and cadmium telluride (CdTe) epitaxial film is formed. Growth rates of 5 microns/hr. are achieved at temperatures as low as 250° C. Excellent surface morphology and thickness uniformity of better than ±3% is obtained. Electrical property measurements indicate p-type carrier concentration of $7 \times 10^{15}$ and room temperature Hall mobility $M_H$ of 80 cm$^2$/V sec.

EXAMPLE 2

The procedure of Example 1 is followed and cadmium telluride epitaxial films are grown on an indium antimonide substrate. Excellent surface morphology and thickness uniformity are obtained. Electrical properties are similar to the cadmium telluride epitaxial films shown in Example 1 above.

EXAMPLES 3-5

Using the procedure of Example 1, but substituting for the dimethylcadmium, dimethylmercury, diethylzinc, a mixture of dimethylmercury and dimethylcadmium, or vaporized mercury carried on a stream of palladium-diffused hydrogen, epitaxial films of HgTe, ZnTe, HgCdTe and HgTe are grown on a cadmium telluride substrate at 220°-300° C.

EXAMPLE 6

An epitaxial composite in the form of a superlattice is prepared by depositing a first layer of cadmium telluride by the procedure of Example 1 on a CdTe substrate, then directing a flow of vaporizable and decomposable organomercury compound and 2,5-dihydrotellurophene against the substrate having an epitaxial layer of cadmium telluride until an epitaxial layer of mercury telluride is deposited thereon, and then repeating the alternating deposition until ten layers are deposited. The procedure can be repeated a number of times even up to one hundred and more times. Each layer in the superlattice will preferably have a thickness in the range of 40 to 250 Angstroms, and the ultimate thickness of the combined layers can range up to several, e.g., 3-4 microns. The procedure can be further modified by producing one or more of a third chemically distinct layer by directing combined flows of a vaporizable and decomposable organomercury compound, dimethylcadmium and 2,5-dihydrotellurophene against the substrate. Upon repetition, the product will be an epitaxial composite of the superlattice type wherein the epitaxial layers are randomly, depending on the order of introduction of reactants, mercury telluride or cadmium telluride and mercury cadmium telluride.

The above-mentioned patents and publications are incorporated herein by reference.

Many variations of this invention will suggest themselves to those skilled in this art in light of the above, detailed description. For example, instead of hydrogen as a carrier gas, helium and argon can be used. Instead of 2,5-dihydrotellurophene, 3-methyl-2,5-dihydrotellurophene, 3,4-dimethyl-2,5-dihydrotellurophene, 3-ethyl-2,5-dihydrotellurophene and 3,4-diethyl-2,5-dihydrotellurophene can be used. The susceptor can be heated to any temperature in the range of 220° C. to 500° C., e.g., 220° to 300° C. most preferably 240° to 300° C. The carrier gas can be omitted. An inverted vertical MOVPE reactor can be used, as may any other reactor configuration, all of them being well known to those skilled in the art. All such obvious variations are within the full intended scope of the appended claims.

We claim:

1. In a method for growing in a reactor a Group II–VI epitaxial layer over a crystalline substrate or over a crystalline substrate having one or more epitaxial layers thereon, said method comprising the steps of:

(i) placing said substrate on a susceptor which is heated to a temperature in the range from about 220° C. to about 300° C.;
   (ii) directing a flow of at least one vaporized Group II component toward said substrate;
   (iii) directing a flow of a vaporized Group VI metalorganic toward said substrate; and
   (iv) reacting the directed flows of Group II component and Group VI metalorganic to form the epitaxial layer, the improvement which comprises using as said Group VI metalorganic a tellurium compound of the formula:

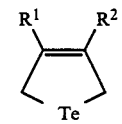

wherein $R^1$ and $R^2$ are, independently hydrogen or alkyl of from 1 to about 4 carbon atoms.

2. In a method for growing in a reactor a Group II–VI epitaxial layer over a crystalline substrate or over a crystalline substrate having one or more epitaxial layers thereon, said method comprising the steps of:

(i) placing said substrate on a susceptor which is heated to a temperature in the range from about 240° C. to about 300° C.;
   (ii) directing a flow of at least one vaporized Group II component toward said substrate;
   (iii) directing a flow of a vaporized Group VI metalorganic toward said substrate; and
   (iv) reacting the directed flows of Group II component and Group VI metalorganic to form the epitaxial layer, the improvement which comprises using as said Group VI metalorganic a tellurium compound of the formula:

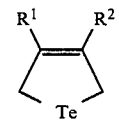

wherein $R^1$ and $R^2$ are, independently hydrogen or alkyl of from 1 to about 4 carbon atoms.

* * * * *